United States Patent
Shimizu et al.

(10) Patent No.: US 6,689,951 B2
(45) Date of Patent: Feb. 10, 2004

(54) PHOTOVOLTAIC ELEMENT AND PROCESS FOR THE PRODUCTION THEREOF

(75) Inventors: Koichi Shimizu, Kyoto-fu (JP); Tsutomu Murakami, Nara-ken (JP); Koji Tsuzuki, Kyouto-fu (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/144,719

(22) Filed: May 15, 2002

(65) Prior Publication Data
US 2003/0019518 A1 Jan. 30, 2003

(30) Foreign Application Priority Data

May 15, 2001 (JP) ........................................ 2001-144228
May 10, 2002 (JP) ........................................ 2002-136053

(51) Int. Cl.[7] ........................ H01L 3/04; H01L 31/0224
(52) U.S. Cl. ........................... 136/256; 257/459; 438/98
(58) Field of Search ....................... 136/256; 257/459; 438/98

(56) References Cited

U.S. PATENT DOCUMENTS

| | | | | |
|---|---|---|---|---|
| 5,296,043 A | * | 3/1994 | Kawakami et al. | 136/244 |
| 5,667,596 A | | 9/1997 | Tsuzuki et al. | 136/256 |
| 5,942,048 A | | 8/1999 | Fujisaki et al. | 136/256 |
| 6,051,778 A | | 4/2000 | Ichinose et al. | 136/256 |
| 6,357,649 B1 | | 3/2002 | Okatsu et al. | 228/179.1 |
| 6,472,594 B1 | * | 10/2002 | Ichinose et al. | 136/256 |
| 6,515,218 B1 | * | 2/2003 | Shimizu et al. | 136/256 |
| 2002/0016016 A1 | * | 2/2002 | Tsuzuki et al. | 438/57 |
| 2002/0139415 A1 | * | 10/2002 | Shimizu et al. | 135/256 |
| 2003/0005955 A1 | * | 1/2003 | Shiotsuka et al. | 136/251 |

FOREIGN PATENT DOCUMENTS

| | | |
|---|---|---|
| JP | 9-36395 | 2/1997 |
| JP | 10-335688 | 12/1998 |

* cited by examiner

*Primary Examiner*—Alan Diamond
(74) *Attorney, Agent, or Firm*—Fitzpatrick, Cella, Harper & Scinto

(57) ABSTRACT

A photovoltaic element having an electrode structure having joining portions (A) in which collecting electrodes are spacedly arranged on a light receiving face side of the photovoltaic element such that they are individually joined to a bus bar electrode. Each of the joining portions (A) has a first joining portion (i) having a first paste. Each of collecting electrodes (b) excluding the collecting electrodes (a) positioned at opposite end sides of the arrangement of the collecting electrodes further has a second joining portion (ii) having a second paste with a smaller resistivity than that of the first paste. A proportion of the first joining portion (i) in the joining portion (A) of each of the collecting electrodes (a) is greater than a proportion of the first joining portion (i) in the joining portion (A) of each of the collecting electrodes (b). A process for the production of the photovoltaic element.

22 Claims, 4 Drawing Sheets

[LINE A-A': CROSS SECTION IN FIG.1(e)]

[LINE A-A': CROSS SECTION IN FIG.1(e)]

(a) 
(b) 
[LINE B-B': CROSS SECTION IN FIG.2(a)]
F I G. 3
(a) 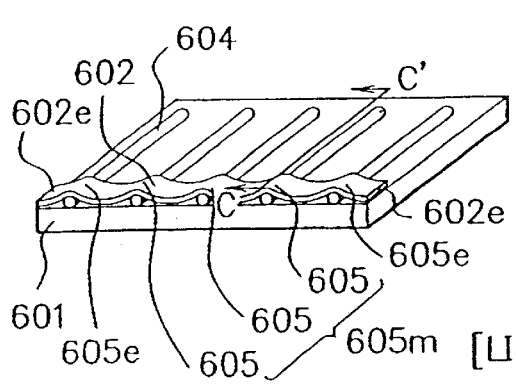
(b) 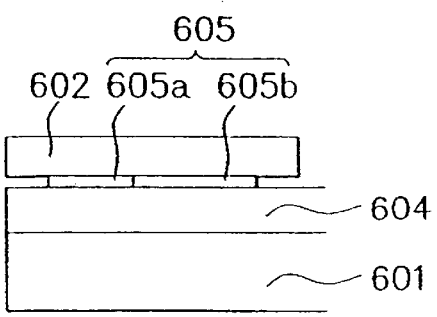
[LINE C-C': CROSS SECTION IN FIG.3(a)]

[LINE E-E': CROSS SECTION IN FIG.5(e)]

PHOTOVOLTAIC ELEMENT AND PROCESS FOR THE PRODUCTION THEREOF

BACKGROUND OF THE INVENTION

1. Field of the Invention

The present invention relates to a photovoltaic element such as a solar cell and a process for the production thereof. More particularly, the present invention relates to a highly reliable photovoltaic element having an improved electrode structure which excels in durability and a process for the production thereof.

2. Related Background Art

In recent years, mainly aiming at reducing pollution gas in the air which causes a global-warming phenomenon, the introduction of a sunlight power generation system has been increasing. Under this circumstance, it is necessary to provide highly reliable photovoltaic elements for use in such sunlight power generation system at a reasonable cost.

As an example of such photovoltaic element which can be provided at a reasonable cost, Japanese Laid-open Patent Publication No. Hei.9(1997)-36395 (hereinafter referred to as document 1) discloses a photovoltaic element having such a configuration as shown in FIGS. 2(a) and 2(b). FIG. 2(a) is a schematic view illustrating a principal portion of an electrode structure of the photovoltaic element on the light incident side. FIG. 2(b) is a schematic cross-sectional view, taken along the line B–B' in FIG. 2(a).

In FIGS. 2(a) and 2(b), reference numeral 501 indicates a photovoltaic element, reference numeral 502 a bus bar electrode comprising a belt-like shaped metal foil, reference numeral 504 a collecting electrode comprising a plurality of metal wires, and reference numeral 505 a joining portion to join the bus bar electrode 502 and the collecting electrode 504. The collecting electrode herein is generally called a finger electrode to the bus bar electrode.

The electric current generated by the photovoltaic element 501 is collected by the collecting electrode 504, followed by being flown to the bus bar electrode 502 while passing through the joining portion 505 where the electric current is collected by the bus bar electrode 502, followed by being guided to the outside.

In the case of a photovoltaic element having such a configuration as shown in FIGS. 2(a) and 2(b) having an electrode structure comprising such bus bar electrode which comprises a belt-like shaped metal foil and such collecting electrode which comprises a plurality of metal wires, the electrode structure is capable of allowing a large quantity of an electric current to flow therein because the electrode structure is relatively small in terms of the electric resistance. Thus, it is considered that when the photovoltaic element is designed to have a large area (a large size in other words), it is possible to increase the quantity of an electric current generated by the photovoltaic element and such photovoltaic element having a large area can be more efficiently produced in comparison with the case of producing a photovoltaic element having a relatively small area, where the photovoltaic element having a large area can be produced at a reduced production cost.

Therefore, it is expected that the technique disclosed in document 1 will be possible to realize a photovoltaic element having a large area and such electrode structure as shown in FIGS. 2(a) and 2(b) which has such advantages as above described at a reasonable production cost.

However, for the photovoltaic element having such electrode structure as shown in FIGS. 2(a) and 2(b) which is disclosed in document 1, the present inventors have found that it has a disadvantage such that as the quantity of an electric current generated by the photovoltaic element is increased, the quantity of the electric current which flows in the collecting electrode is also increased to deteriorate the performance of the photovoltaic element. And in order to eliminate this disadvantage, the present inventors have found that it is important to decrease the electric resistance particularly of the joining portion (505) of the electrode structure so as to diminish the power loss in the joining portion in order to prevent the performance of the photovoltaic element from being deteriorated.

In order to achieve this aim, it is considered to be effective that the electric resistance of the joining portion is decreased by making the joining portion to comprise a combination of a carbon paste and an electrically conductive paste comprising an electrically conductive filler and a binder and which has excellent electric conductivity.

However, this method has found to be difficult to attain a reduction in the electric resistance of the joining portion and an improvement in the strength of the joining portion at the same time. For the reason for this, it is considered such that in order to obtain an electrically conductive paste, it is necessary to increase the ratio of the electrically conductive filler to the binder, but then the ratio of the electrically conductive filler is increased in this way, the adhesive strength of the electrically conductive paste is decreased.

SUMMARY OF THE INVENTION

The present invention is aimed at solving the foregoing problems in the prior art and achieving a highly reliable photovoltaic element having an improved electrode structure in which the power loss due to the electric resistance upon collecting an electric current from the photovoltaic element is diminished and which has improved durability.

Another object of the present invention is to provide a photovoltaic element having at least a photoelectric conversion layer provided on a substrate, said photovoltaic element having a plurality of collecting electrodes spacedly arranged over a light receiving face of said photoelectric conversion layer in parallel to each other and a bus bar electrode having a desired width which is joined to said plurality of collecting electrodes to have a plurality of joining portions (A) in which said plurality of collecting electrodes are individually joined to said bus bar electrode, wherein each of said plurality of joining portions (A) has a first joining portion (i) comprising a first paste, of said plurality of collecting electrodes, each of the collecting electrodes (b) excluding the collecting electrodes (a) positioned at opposite end sides-of the arrangement of said plurality of collecting electrodes further has a second joining portion (ii) comprising a second paste having a smaller resistivity than that of said first paste at the joining portion (A) thereof with the bus bar electrode, and a proportion of the first joining portion (i) in the joining portion (A) of the collecting electrode and the bus bar electrode with respect to each of the collecting electrodes (a) is greater than a proportion of the first joining portion (i) in the joining portion (A) of the collecting electrode and the bus bar electrode with respect to each of the collecting electrodes (b).

This photovoltaic element having such electrode structure has a significant advantage in that the power loss due to the electric resistance upon collecting an electric current from the photovoltaic element is greatly diminished and has excellent durability.

In a preferred embodiment of this photovoltaic element, the collecting electrodes (a) positioned at opposite ends of the arrangement of the plurality of collecting electrodes respectively have only the first joining portion (i), each of the collecting electrodes comprises a metal wire covered by an electrically conductive paste capable of serving as the first paste, the first paste comprises a carbon paste, and the second paste comprises a paste of a metal powder.

A further object of the present invention provides a process for producing a photovoltaic element having at least a photoelectric conversion layer provided on a substrate, a plurality of collecting electrodes spacedly arranged over a light receiving face of said photoelectric conversion layer in parallel to each other and a bus bar electrode which is joined to said plurality of collecting electrodes to have a plurality of joining portions in which said plurality of collecting electrodes are individually joined to said bus bar electrode.

This production process includes the following two embodiments.

A first embodiment of the production process comprises the steps of:

(1) providing a photovoltaic body having at least a photoelectric conversion layer formed on a substrate, (2) spacedly arranging a plurality of collecting electrodes (a) having a coat comprising a first paste over a light receiving face of said photoelectric conversion layer of said photovoltaic body in parallel to each other, (3) of said plurality of collecting electrodes (a), removing part of the coat of each of at least the collecting electrodes (a') excluding the collecting electrodes (a") positioned on opposite end sides of the arrangement of the collecting electrodes (a), (4) for the coat of each of the collecting electrodes (a"), not removing part thereof or removing part thereof which is smaller than the part in said step (3), (5) applying a second paste whose resistivity is smaller than that of the first paste to the coat-removed portion of each of the collecting electrodes whose coats are partly removed, and (6) arranging a bus bar electrode having a desired width over the collecting electrodes (a) to cover their coat-removed portions and joining said bus bar electrode to the collecting electrodes (a) to form an electrode structure over said photoelectric conversion layer, whereby a photovoltaic element is obtained.

A second embodiment of the production process comprises the steps of:

(1) providing a photovoltaic body having a photoelectric conversion layer and a transparent electrode layer formed in this order on a substrate, (2) forming a division groove on a light receiving face of said transparent electrode layer of said photovoltaic body in a direction perpendicular to the longitudinal direction of the substrate so that the light receiving face of the transparent electrode layer has two zones which are divided by said division glove, (3) spacedly arranging a plurality of collecting electrodes (i) having a coat comprising a first paste over the light receiving face of the transparent electrode layer of the photovoltaic body such that said plurality of collecting electrodes are in parallel to the groove of the transparent electrode layer so that two of the collecting electrodes are positioned on opposite sides of the division groove so as to oppose to each other, (4) of the collecting electrodes (i-a) arranged over the light receiving face of the transparent electrode layer, removing part of the coat of each of at least the collecting electrodes (i-a') excluding the collecting electrodes (i-a") positioned on the opposite sides of the division grove, (5) for the coat of each of the collecting electrodes (i-a"), not removing part thereof or removing part thereof which is smaller than the part in said step (4), (6) applying a second paste whose resistivity is smaller than that of the first paste to the coat-removed portion of each of the collecting electrodes whose coats are partly removed, (7) arranging a bus bar electrode having a desired width over the collecting electrodes (i) so as to cover their coat-removed portions and joining said bus bar electrode to the collecting electrodes (i), and (8) cutting the substrate of the photovoltaic body along the division grove of the transparent electrode layer to obtain a plurality of photovoltaic elements.

In each of the above first and second embodiments, the step of removing part of the coat of the collecting electrode is preferred to include a step of irradiating laser beam to the coat of the collecting electrode.

The application of the second paste is preferred to be performed so that the second paste is applied in an ellipse form having a long axis in a direction of intersecting the longitudinal direction of the collecting electrode, particularly so that the second paste is applied to the coat-removed portions of the end-sided collecting electrodes in a complete round form and it is also applied to the coat-removed portions of other collecting electrodes in an ellipse form having a long axis in a direction of intersecting the longitudinal direction of the collecting electrode.

The constitutions, advantages, and preferred embodiments of the present invention will be detailed with reference to the drawings later.

BRIEF DESCRIPTION OF THE DRAWINGS

FIGS. 3(*a*) and 3(*b*) are schematic views illustrating an example of a photovoltaic element having a specific electrode structure according to the present invention.

DESCRIPTION OF THE INVENTION AND PREFERRED EMBODIMENTS

Figure 1:
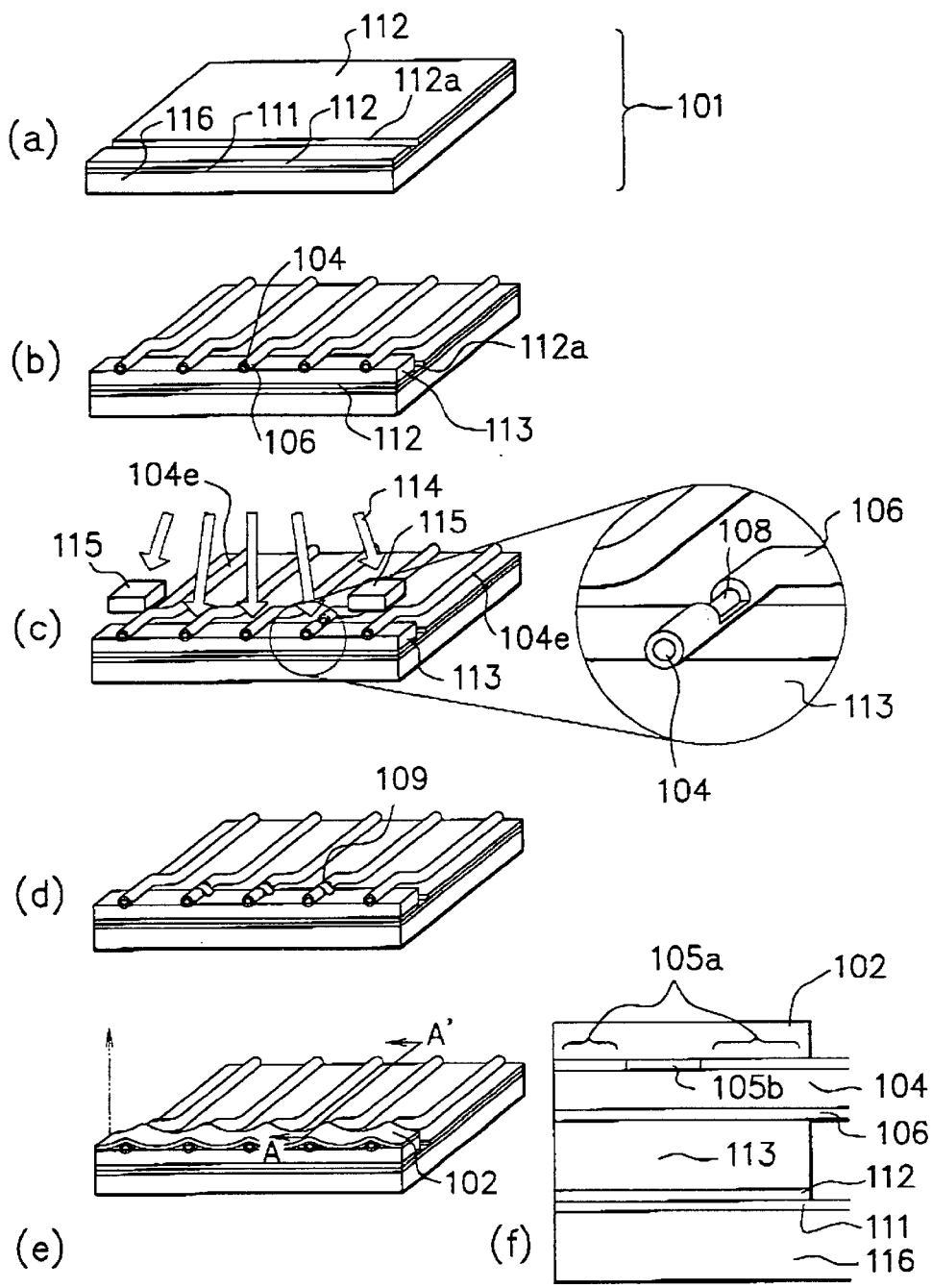
FIGS. 1(*a*) to 1(*f*) are schematic views for explaining an example of a process for producing a photovoltaic element of the present invention.
Figure 2:
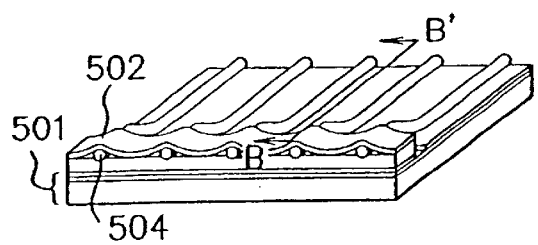
FIGS. 2(*a*) and 2(*b*) are schematic views illustrating an example of a photovoltaic element having a conventional electrode structure.
Figure 2:
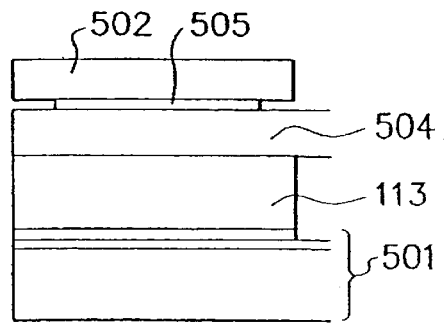

In the following, preferred embodiments of the present invention will be described while referring to the drawings.

Description will be made of a photovoltaic element of the present invention.

FIG. 3(*a*) is a schematic slant view illustrating an example of a photovoltaic element having a specific electrode structure according to the present invention. FIG. 3(*b*) is a schematic cross-sectional view, taken along the line C–C' in FIG. 3(*a*).

FIGS. 3(*a*) and 3(*b*) are for explaining constitution and advantages of a typical example of an electrode structure according to the present invention, which is provided in a photovoltaic element. It should be understood that the scope of the present invention is not restricted to the embodiment shown in FIGS. 3(a) and 3(b).

In FIGS. 3(a) and 3(b), reference numeral 601 indicates a photovoltaic body comprising a photoelectric conversion layer and a transparent electrode layer stacked in this order on a substrate (not shown), reference numeral 602 a bus bar electrode comprising a belt-like shaped metal member such as a metal foil or the like, and reference numeral 604 a collecting electrode comprising, for example, a metal wire. As shown in FIG. 3(a), a plurality of collecting electrodes 604 are spacedly arranged on the surface (the light receiving face) of the photovoltaic body 601.

In FIG. 3(a), reference numeral 605 is directed to a surface of the bus bar electrode 602 because of circumstances of the figure, but as will be understood with reference to FIG. 3(b), it indicates a joining portion where the bus bar electrode 602 is joined with the collecting electrode 604. Similarly, reference numeral 605e which is directed to a surface of the bus bar electrode 602 under which the collecting electrode on the outermost side of the arrangement of the collecting electrodes 604 is situated indicates an outermost side joining portion where the outermost side collecting electrode is joined with the bus bar electrode. Reference numeral 602e indicates an end portion of the bus bar electrode 602. Reference numeral 605m indicates the joining portions 605 of the collecting electrodes situated between the two outermost side collecting electrodes.

Electric current generated by the photovoltaic body 601 flows the surface of the photovoltaic body, followed by being collected by the collecting electrodes 604. The electric current collected by the collecting electrodes 604 flows to the bus bar electrode 602 while passing through the joining portions 605 of the collecting electrodes 604 with the bus bar electrode 602 where the electric current is collected by the bus bar electrode 602, followed by being guided to the outside.

The photovoltaic element of the present invention has such electrode structure comprising the bus bar electrode 602 and the plurality of collecting electrodes 604.

Now, particularly, FIG. 3(b) is an enlarged cross-sectional view of the joining portion 605 of the bus bar electrode 602 and the collecting electrode 604, when taken along the line C–C' in FIG. 3(a). As will be understood with reference to FIG. 3(b), the joining portions 605 of the collecting electrodes 604 with the bus bar 602 have at least either a first joining portion 605a where the bus bar electrode 602 and the collecting electrode 604 are joined by means of a first electrically conductive paste or a second joining portion 605b where the bus bar electrode 602 and the collecting electrode 604 are joined by means of a second electrically conductive paste having a resistivity which is smaller than that of the first electrically conductive paste, wherein at least one of the joining portions 605 has said first joining portion and at least one of the joining portions 605 has said second joining portion. This means to exclude a case where all the joining portions 605 comprise said first joining portion only or said second joining portion only.

According to this electrode structure, the second joining portion whose resistivity is relatively small and whose adhesive strength is relatively small and the first joining portion whose resistivity is relatively large and whose adhesive strength is relatively large are complemented with each other with respect to their properties. This enables to realize a highly durable photovoltaic element which affords a large power output.

In a preferred embodiment, the joining portion 605e of each of the two collecting electrodes 604 each situated at a position nearest to one of the opposite end portions 602e of the bus bar electrode 602 in the longitudinal direction thereof is made to comprise the first joining portion only. By doing in this way, the joining portion 605e of each of the two outermost side collecting electrodes 604 which are liable to separate is secured in terms of the strength so that the joining portion 605e is always prevented from being separated, where the collecting electrodes are made to have a low electric resistance and as a result, the reliability of the photovoltaic element is improved. Further, by making the joining portion 605e of each of the outermost side two collecting electrodes 604 to have the first joining portion at a large proportion, even when a second electrically conductive paste having a large flowability which is yet cured is used in the formation of the second joining portion, the second electrically conductive paste is prevented from being issued from each of the end sides of the arrangement of the collecting electrodes. Thus, in the case where the joining portion 605e of each of the two outermost side collecting electrodes 604 has the first joining portion and the second joining portion, it is preferred that a proportion of the first joining portion is made to be larger than that of the second joining portion, in comparison with other joining portions 605m of the remaining collecting electrodes where said other joining portions have the first joining portion and the second joining portion.

Consequently, in the most preferred embodiment, the joining portion 605e of each of the two outermost side collecting electrodes 604 comprises the first joining portion only.

When the electrode structure is designed in this way, there is not a fear in that the second electrically conductive paste is issued. In addition, even when the cured degree of the first electrically conductive paste constituting the first joining portion is insufficient such that the first electrically conductive paste is flown out to reach the back face of the photovoltaic element in the worst case, by using an electrically conductive paste having a sufficiently large resistivity as the first electrically conductive paste constituting the first joining portion, the electric resistance in the in-plane direction can be made to be very large so that serious problems such as short circuit and the like are not occurred. This makes it possible to produce a highly reliable photovoltaic element at a high productivity.

Further, it is preferred that at least the joining portions 605 (that is, the joining portions 605m) of the collecting electrodes situated between the two outermost side collecting electrodes have the second joining portion in addition to the first joining portion.

By making a large part of the joining portions to have the second joining portion whose electric resistance is relatively small in this way, the power loss due to the electric resistance can be diminished as smaller as possible. To exclude the two outermost side collecting electrodes in this case is due to a reason that the joining portion of each of the two outermost side collecting electrodes which are liable to separate is desired to be secured in terms of the physical strength as much as possible by the fist joining portion.

FIGS. 4(a) to 4(f) are schematic views for explaining a preferred example of a process for producing a photovoltaic element of the present invention.

FIGS. 4(a) to 4(f) includes explanation of a preferred embodiment of a photovoltaic element of the present invention and advantages thereof. It should be understood that the scope of the present invention is not restricted by FIGS. 4(a) to 4(f).

In the following, an embodiment of the process for the production of a photovoltaic element of the present invention will be detailed with reference to FIGS. 4(a) to 4(f). The production process is featured to include at least five steps which will be described below.

In 1st step [see, FIG. 4(a)], there are provided a plurality of collecting electrodes 704, and at a prescribed portion of each collecting electrode, a coat 706 comprising a semi-cured first electrically conductive paste is formed.

The prescribed portion of the collecting electrode here is meant a portion of the collecting electrode including a portion thereof which is substantially overlapped (contacted) with a bus bar electrode (not shown) when after the collecting electrode is fixed on a surface (a light receiving face) of a photovoltaic body, the bus bar electrode is arranged in a joining step which will be described later. This includes a case where the coat is formed only at the portion of the collecting electrode which is contacted with a bus bar electrode as shown in the embodiment of FIG. 4(a) and also a case where the coat is formed at the entirety of a metal wire as the collecting electrode as in Example 1 which will be described later.

The formation of the coat may be performed by a coating method by means of a roll coater or a coating method wherein a collecting electrode is passed through a felt impregnated with a given resin and heated for a prescribed period of time. To make the coat to be in a semi-cured state may be performed by a method wherein a thermosetting resin is applied in order to form the coat and the thermosetting resin applied is crosslinked to an adequate extent or a method wherein a resin containing a solvent in a given amount is applied in order to form the coat and the solvent contained in the resin applied is vaporized to an adequate extent.

In 2nd step [see, FIG. 4(b)], the collecting electrodes 704 having the coat 706 are spacedly arranged and fixed on a surface (a light receiving face) of a photovoltaic body 701.

To fix the collecting electrodes 704 on the surface of the photovoltaic body 701 is preferred to be performed by a relatively simple method wherein a double-coated adhesive tape (not shown) is arranged at each of portions of the surface of the photovoltaic body where the collecting electrodes are fixed and the collecting electrodes are laid on the double-coated tapes on the surface of the photovoltaic body. Besides, to fix the collecting electrodes on the surface of the photovoltaic body may be performed by a method of using other appropriate adhesive material or a clip.

In 3rd step [see, FIG. 4(c)], part of the coat 706 of each of the collecting electrodes 704 is removed to form a coat-removed portion 708.

In a preferred embodiment in this coat-removing step, part of the coat of each of only the collecting electrodes excluding the two collecting electrodes each situated at a position nearest to one of the opposite end portions of a bus bar electrode in the longitudinal direction thereof which is arranged in a joining step which will be described later. This means that the joining portion of each of the two outermost side collecting electrodes, which are liable to separate, with the bus bar electrode is made to comprise a first joining portion as will be described later. This makes the joining portion of each of the two outermost side collecting electrodes with the bus bar electrode to be secured in terms of the strength so that the joining portions of the two outermost side collecting electrodes are always prevented from being separated. This situation leads to improve the durability of the photovoltaic element.

The formation of the coat-removed portion 708 may be performed by a method wherein par of the coat is cut off by means of a rooter, a method wherein part of the coat is eluted off by means of a chemical reagent, or a method wherein laser beam is irradiated to part of the coat to remove said part. Of these methods, the method by the irradiation of the laser beam is the most appropriate for the following reason. In accordance with the processing by the laser beam, fine processing is possible where the magnitude and the position of the coat-removed portion 708 can be readily controlled as requited and therefore, the joining length of the first joining portion 705a [see, FIG. 4(f) which is a view of a cross section along the line D–D' in FIG. 4(e)] which is described layer can be readily controlled.

As the laser beam used in this case, it is possible to use any laser beam as long as it has a wavelength which is absorbed by the coat. As preferable specific examples of the source of such laser beam, there can be mentioned excimer laser, YAG laser and $CO_2$ laser.

The irradiation of the laser beam is preferred to be performed by a method wherein the laser beam is irradiated to only a necessary portion of the coat using a shielding mask (not shown). In this case, by means of the shielding mask, the laser beam is prevented from being irradiated to unnecessary portions of the coat, whereby the magnitude and the position of the coat-removed portion can be surely controlled as required. Particularly, the joining length L1+L1' of the first joining portion 705a [see, FIG. 4(f)] is surely controlled as required. Further, it is preferred that the surface of the shielding mask includes a surface at which the laser beam irradiated is scattered, in order to prevent occurrence of a problem in that the energy of the laser beam is absorbed by the shielding mask where the energy is converted into beat and as a result, the shilding mask is expanded or deformed. This leads to surely control the magnitude (including the length) and the position of the coat-removed portion 708 formed.

In 4th step [see, FIG. 4(d)], a second electrically conductive paste 709 whose resistivity is smaller than that of the first electrically conductive paste is adhered to the coat-removed portion 708 of each of the collecting electrodes. Reference numeral 704e indicates one of the two collecting electrodes each situated at a position nearest to one of the opposite end portions of the bus bar electrode in the longitudinal direction thereof which is arranged in the joining step which will be described later.

This step of adhering the second electrically conductive paste may be performed by a conventional coating method or a conventional bonding method. Particularly, it is preferred to adopt a method using a dispenser wherein the second electrically conductive paste 709 is extruded from the nozzle because this method is simple and can be readily practiced.

The method of adhering the second electrically conductive paste 709 to each of the coat-removed portions 708 as shown in FIG. 4(d) is preferred to be a method wherein the second electrically conductive paste 709 is adhered to the coat-removed portion in an ellipse form having a long axis in a direction of intersecting the longitudinal direction of the collecting electrode to form a second joining portion. In this case, it is more preferred that no second joining portion is formed at the joining portion of each of the two outermost side collecting electrodes 704e with the bus bar electrode [however, in FIG. 4(d), there is shown an embodiment in that the second joining portion is formed also at the joining portion of each of the two outermost side collecting electrodes 704e].

By adhering the second electrically conductive paste 709 to the coat-removed portion 708 of each of the collecting electrodes 704 in an ellipse form having a long axis in a direction of intersecting the longitudinal direction of the collecting electrode as above described, the positioning upon adhering the second electrically conductive paste 709 to the coat-removed portion 708 becomes possible to be readily performed. As a result, the second electrically conductive paste 709 can be surely adhered on the coat-removed portion 708. Particularly in this case, it is preferred that the coat-removed portion 708 is not formed at the coat of each of the two outermost side collecting electrodes 704e. That is, the joining of each of the two outermost side collecting electrodes 704e with the bus bar electrode is preferred to be performed only by the first electrically conductive paste. By this, the joining portion of each of the two outermost side collecting electrodes 704e with the bus bar electrode is strengthened in terms of the joining strength, and this leads to make the photovoltaic element have an improved durability.

Separately, in this 4th step, the method of arranging the second electrically conductive paste 709 in the cover-removed portion of each of the collecting electrodes is preferred to be a method wherein the second electrically conductive paste is adhered to the cover-removed portion of each of the two outermost side collecting electrodes in a complete round form and the second electrically conductive paste is adhered to the cover-removed portion of each of the remaining collecting electrodes in an ellipse form having a long axis in a direction of intersecting the longitudinal direction of the collecting electrode.

By adhering the second electrically conductive paste 709 to the cover-removed portion of each of the two outermost side collecting electrodes in a complete round form in this way, it is possible to prevent occurrence of a problem in that the second electrically conductive paste is issued from the neighborhood of each of the opposite end portions of the bus bar electrode to electrically shortcircuit end portions of the front portion of the photovoltaic body 701 with the back face thereof.

In 5th step [see, FIG. 4e and FIG. 4f which is a view of a cross section along the line D–D' in FIG. 4(e)], a bus bar electrode 702 is laid on the arrangement of the collecting electrodes 704 so that the bus bar electrode has portions where the bus bar electrode is overlapped (contacted) with the first electrically conductive pastes and the second electrically conductive pastes of the collecting electrodes, whereby the collecting electrodes are joined with the bus bar electrode.

As will be understood with reference to FIG. 4(f), a portion of the first electrically conductive paste which is overlapped (contacted) with the bus bar electrode becomes to be a first joining portion of the portion 705a and a portion of the second electrically conductive paste which is overlapped (contacted) with the bus bar electrode becomes to be a second joining portion of the portion 705b.

The production process of a photovoltaic element in the present invention includes the above-described five steps.

Now, in the production process of a photovoltaic element in the present invention, it is preferred to make such that a proportion of the joining length L2 of the second joining portion 705b in the joining portion of each of the two outermost side collecting electrodes 704e with the bus bar electrode to the joining length L1+L1' of the first joining portion in said joining portion is smaller than a proportion of the coining length L2 of the second joining portion 705b in the joining portion of each of the collecting electrodes (excluding the two outermost side collecting electrodes 704e) with the bus bar electrode to the joining length L1+L1' of the first joining portion in said joining portion.

To control the proportion between the L1+L1' and the L2 as above described can be more surely performed in accordance with the method wherein the once semi-cured first electrically conductive paste is partly removed as above described than a case in accordance with a method wherein a non-cured first electrically conductive paste as the first electrically conductive paste and a non-cured second electrically conductive paste as the second electrically conductive paste are separately applied in independent steps, because in the latter method, each of the two non-cured electrically conductive pastes is flown out to unnecessary portions, where it is difficult to control the joining length L1+L1' and the joining length L2 as required.

In the following, each of the components constituting the photovoltaic element of the present invention will be detailed.

Photovoltaic Body

The term "photovoltaic body" in the present invention is meant an intermediate in process to complete a photovoltaic element by forming an electrode structure on the light receiving face side thereof.

The photovoltaic body can includes photovoltaic bodies having at least a photoelectric conversion layer which functions to generate an electromotive force when it is irradiated with light. Such photovoltaic body may have, other than said photoelectric conversion layer, a substrate to retain said photoelectric conversion layer, a transparent electrode layer and if necessary, a light reflection preventive film stacked in this order on the photoelectric conversion layer, and if necessary, a back electrode layer or the like between the substrate and the photoelectric conversion layer.

Specifically such photovoltaic element can include photovoltaic bodies whose photoelectric conversion layers comprising various semiconductor materials and other photovoltaic bodies whose photoelectric conversion layers comprising various pigments. The former photovoltaic bodies can be classified, from the viewpoint of the kinds of the semiconductor materials used therein, into silicon series photovoltaic bodies in which silicon-containing semiconductor materials are used and compound semiconductor series photovoltaic bodies in which compound semiconductor materials represented by gallium arsenide or cadmium sulfide are used. These photovoltaic bodies can be also classified, from the viewpoint of a semiconductor junction, into p-n junction type photovoltaic bodies, p-i-n junction type photovoltaic bodies., and Schottky barrier type photovoltaic bodies. These photovoltaic bodies can be classified, from the viewpoint of the crystal structure, into single crystal type photovoltaic bodies, polycrystalline type photovoltaic bodies, microcrystalline type photovoltaic bodies, and amorphous type photovoltaic bodies. These photovoltaic bodies can be further classified, from the view point of the layer structure, into single cell type photovoltaic bodies, tandem cell type photovoltaic bodies, triple cell type photovoltaic bodies, and the like.

The present invention concerns an electrode structure of a photovoltaic element in which any of the above-mentioned photovoltaic element bodies is used.

The present invention can be applied to any kinds of photovoltaic elements as long as they comprise a photovoltaic body and an electrode structure formed over said photovoltaic body in that a plurality of electrodes are arranged and fixed on the surface (the light receiving face)

of the photovoltaic body and a bus bar electrode is arranged to join with said plurality of collecting electrodes such that each of said plurality of collecting electrodes has a joining portion with the bus bar electrode.

The present invention provides an effect to enhance the resistance against a stress which is applied to an electrode connection portion (or an electrode joining portion) of a photovoltaic element, for example, in the process of producing a photovoltaic element, in the process of producing a module by serializing a plurality of photovoltaic elements and integrating the resultant with a protective material or in the process of producing a sunlight power generation system, or in practical use of the system outdoors. Particularly, when the present invention is applied to a photovoltaic element having an electrode structure in that stress is liable to be added to the electrode connection portion, the effect of the present invention becomes significant. In general, it is considered that as the flexibility or area of the entirety of a photovoltaic element becomes larger, stress added to the electrode connection portion (or the electrode joining portion) becomes larger and the duration where the stress is added becomes longer. Especially, when the present invention is applied to a photovoltaic element formed on a flexible substrate such as a SUS stainless steel plate and having a size of more than several cm square, the effect of the present invention becomes significant.

Bus Bar Electrode

As previously described, the bus bar electrode is provided so as to join with the plurality of collecting electrodes provided on the light receiving face of the photovoltaic element and it functions to take up an electric current which is collected by and flown from the collecting electrodes and guide the current to the outside of the photovoltaic element.

It is preferred that the bus bar electrode is shaped in a belt-like form having a given width and a given length. The width of the bus bar electrode is preferred to be about $1/100$ to about $1/10$ of the width of a photovoltaic element involved in a direction perpendicular to the longitudinal direction in order that the effective area of the photovoltaic element is not excessively decreased and the resistance of the bus bar electrode can be reduced as desired. The length of the bus bar electrode is preferred to be of an extent which substantially corresponds to the length of the photovoltaic element in order that the resistance of the bus bar electrode is made to be not excessive but adequate and the electric current from the correcting electrodes is guided to the outside of the photovoltaic element. The thickness of the bus bar electrode is generally made to be in a range of several tens to several hundreds $\mu m$.

In a preferred embodiment, the bus bar electrode comprises a belt-like shaped metal foil whose width, length and thickness respectively fall in the above described range. The belt-like shaped metal foil as the bus bar electrode can include belt-like shaped metal foils made of metals such as Cu, Al, Au, Ag, Fe, Sn, Pb, Zn, Ni, Cr, Mn, Mo, and W or alloys thereof. These belt-like shaped metal foils may have a plated layer or a clad layer formed thereon.

Collecting Electrode

As previously described, the collecting electrodes are spacedly arranged on the surface (the light receiving face) of the photovoltaic element. The collecting electrodes function to collect an electric current generated by the photovoltaic body and guide the current to the bus bar electrode. In general, the collecting electrodes are spacedly arranged on the surface of the photovoltaic element in a comb-like form. Besides, as for the arrangement form of the collecting electrodes on the surface of the photovoltaic element, there are known a grid form and a leaf vein form. The present invention concerns the joining portions of the collecting electrodes comprising a metal wire or the like with the bus bar electrode. Therefore, the effects of the present invention do not depend on the arrangement form of the collecting electrodes on the surface of the photovoltaic element. However, it is necessary to arrange the collecting electrodes so that incident light is not obstructed from impinging into the photovoltaic body and the face resistance of the surface of the photovoltaic body having a high resistivity is lowered. Therefore, it is preferred that the collecting electrodes are spacedly arranged over the entire surface of the photovoltaic body at an equal interval. In the case where a plurality of metal wires are used as the collecting electrodes, it is preferred to adopt an arrangement form in that said plurality of metal wires are arranged at an equal interval, because such arrangement form can be readily established. To fix the metal wires on the surface of the photovoltaic body can be performed by means of an electrically conductive paste or a metallic material whose melting point is low.

As such metal wire used as the collecting electrode, any wire made of a metal can be used without any particular limitation. As specific examples of such metal as the constituent of the metal wire, there can be mentioned metals such as Cu, Al, Au, Ag, Fe, Sn, Pb, Zn, Ni, Cr, Mn, Mo and W and alloys thereof. The thickness of the metal wire is preferred to be in a range of from about 10 to about 500 $\mu m$ for the reason that the metal wire has an adequate electric resistance and an adequate strength and it does not undesirably obstruct incident light from impinging into the photovoltaic body. The metal wire is preferred to be of a cross section in a circular form. This is not limitative. The metal wire may be of a cross section in any other form such as an ellipse form, a polygonal form or the like. The metal wire may be of a multi-layered structure, for instance, a structure in that a core comprising the metal wire is covered by a metallic material layer formed by means of plating or cladding.

Electrically Conductive Paste

The electrically conductive paste used in the present invention contains a resin which is curable and adhesive to the collecting electrodes and the bus bar electrode. As specific examples of such resin, there can be mentioned synthetic resins such as thermoplastic resin, thermosetting resin, elastomer, and mixtures thereof. Besides, natural organic materials such as starch, glue, rosin, asphalt, and tar are also usable. The electrically conductive paste is preferred to be an electrically conductive paste comprising an electrically conductive powder (comprising electrically conductive particles) of an electrically conductive material dispersed in such resin as above mentioned. Such electrically conductive material can includes carbon materials such as carbon black and graphite; metals such as Cu, Al, Au, Ag, Fe, Sn, Pb, Zn, Ni, Cr, Mn, Mo and W and alloys thereof; and metal oxides such as indium oxide, tin oxide, and indium-tin oxide. A paste obtained by dispersing a carbon black powder having a carbon material powder having an average particle size in a range of several tens to several hundreds nm in a thermoplastic resin or a thermosetting resin corresponds to a carbon paste. And a paste obtained by dispersing a metal powder having an average particle size in a range of several tens to several hundreds nm in a thermoplastic resin or a thermosetting resin corresponds to a metal powder paste.

In the present invention, it is preferred to use a highly resistive electrically conductive paste or an insulating electrically conductive paste represented by aforesaid carbon paste having a relatively high adhesive strength as the first electrically conductive paste because the strength of the joining portion of the collecting electrode with the bus bar electrode where the joining portion has a joining portion comprising said electrically conductive paste is enhanced. As the second electrically conductive paste, it is preferred to use a low resistive electrically conductive paste represented by aforesaid metal powder paste because the resistance of the joining portion of the collecting electrode with the bus bar electrode where the joining portion has a joining portion comprising said electrically conductive paste is diminished.

Joining Portion

Figure 4:
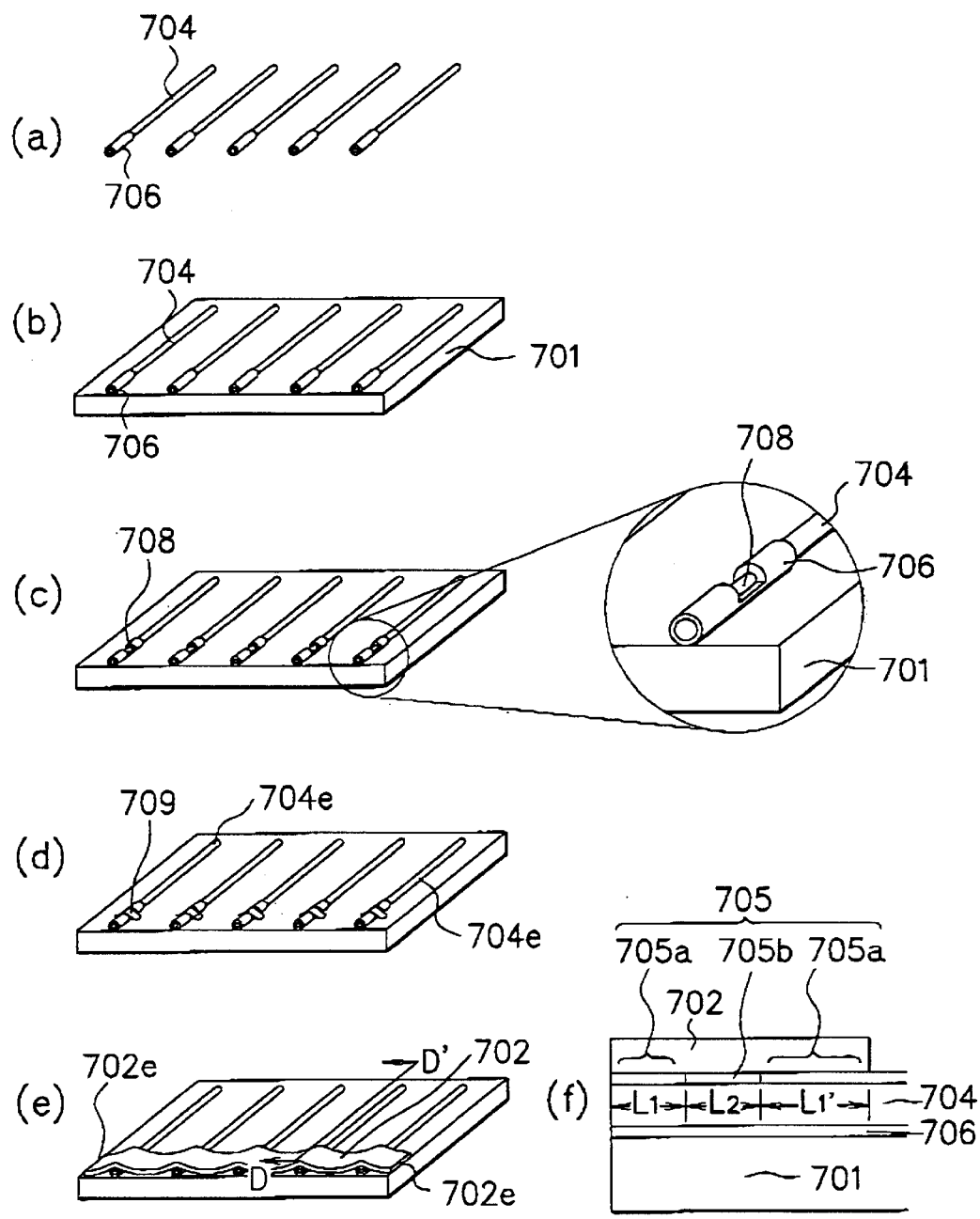
FIGS. 4(*a*) to 4(*f*) are schematic views for explaining another example of a process for producing a photovoltaic element of the present invention.

As previously described, the joining portion in the present invention is meant a portion, for instance as indicated by reference numeral 705 in FIG. 4(*f*), where the metal wire (704) as the collecting electrode and the bus bar electrode (702) (comprising a metal foil) are mechanically and/or electrically connected with each other. As long as the relative position between the collecting electrode and the bus bar electrode is retained and electrical continuation between the collecting electrode and the bus bar electrode is maintained, the presence of a directly contacted portion between the collecting electrode and the bus bar electrode is not problematic.

All the joining portions of the collecting electrodes 704 (excluding the two outermost side collecting electrodes 704*e*) with the bus bar electrode [see, FIG. 4(*d*)] are not always necessary to have the second joining portion, where it possible that at least one of said joining portion has the second joining portion. However, in order to reduce the electric resistance of the entire joining portions of the collecting electrodes with the bus bar while maintaining the strength of the joining portions of the two outermost side collecting electrodes 704*e* with the bus bar, it is preferred that all the joining portions of the collecting electrodes 704 (excluding the two outermost side collecting electrodes 704*e*) with the bus bar electrode have the second joining portion.

Joining Length

As previously described with reference to FIG. 4(*f*) which shows that L1+L1' is the joining length of the first joining portion and L2 is the joining length of the second joining portion, the joining length in the present invention is meant a length of the first joining portion and a length of the second joining portion of the collecting electrode, respectively measured along the longitudinal direction of the collecting electrode.

The photovoltaic element and the production process thereof according to the present invention will be described in more detail with reference to the following examples. It should be understood that these examples are only for illustrative purposes and not intended to restrict the scope of the present invention.

EXAMPLE 1

FIGS. 1(*a*) to 1(*e*) are schematic views illustrating steps of producing a photovoltaic element in this example. FIG. 1(*f*) is a schematic cross-sectional view, taken along the line A–A' in FIG. 1(*e*).

Step 1 [see, FIG. 1(*a*)]

A photovoltaic body 101 was prepared as will be described below.

A stainless steel substrate 116 having a width of 36 mm and a thickness of 150 $\mu$m wound in a roll form was introduced into a roll-to-roll sputtering apparatus, where an Al layer (not shown) having a thickness of 200 nm and a ZnO layer (not shown) having a thickness of 1 $\mu$m were sequentially formed to form a two-layered lower electrode on the stainless steel substrate. The stainless steel substrate 116 having the two-layered lower electrode formed thereon was introduced into a microwave plasma CVD film-forming apparatus, where on the two-layered lower electrode formed on the stainless steel substrate 116, there was formed an amorphous silicon photoelectric conversion layer 111 having a stacked structure with three p-i-n junctions by sequentially forming a bottom semiconductor layer having a three-layered structure comprising an a-type semiconductor layer/ an i-type semiconductor layer/a p-type semiconductor layer; a middle semiconductor layer having a three-layered structure comprising an n-type semiconductor layer/an i-type semiconductor layer/a p-type semiconductor layer; and a top semiconductor layer having a three-layered structure comprising an n-type semiconductor layer/an i-type semiconductor layer/a p-type semiconductor layer.

Thereafter, on the photoelectric conversion layer 111, there was formed an ITO film having a thickness of 70 nm as a transparent electrode layer 112 having a function to serve also as a light reflection preventive layer was formed at a film-forming temperature of 450° C. by means of a sputtering process.

The stainless steel substrate 116 having the photoelectric conversion layer 111 and the transparent electrode layer 112 formed thereon was cut to obtain a plurality of photovoltaic bodies having a width of 24 cm and a length of 18 cm. For each of the resultant photovoltaic bodies, a peripheral portion 112*a* having a width of 1 mm of the transparent electrode layer 112 in the longitudinal direction was removed (not shown) to form a division groove 112*a* having a width of 1 mm.

An electrolytic etching process was used for removing the prescribed portion of the transparent electrode layer, wherein the substrate (the photovoltaic body) was dipped in a sulfuric acid solution and an electric field was applied between the substrate and a counter electrode.

Thus, 100 photovoltaic bodies 101 having such configuration as shown in FIG. 1(*a*) were obtained.

Step 2 [see, FIG. 1(*b*)]

In this step, a plurality of metal wires 104 whose surfaces are covered by a semi-cured coat were spacedly arranged and fixed on the surface of each photovoltaic body 101 as will be described below.

An insulating double-coated adhesive tape 113 having a width of 7 mm and a length of 240 mm was fixed on the transparent electrode layer 112 of each photovoltaic body 101. To be more specific, the insulating double-coated adhesive tape 113 was stuck on the divided portion of the transparent electrode layer 112 situated outside the division groove 112*a* as shown in FIG. 1(*b*).

As the insulating double-coated adhesive tape 113, there was used a double-coated adhesive tape comprising a base member (comprising a composite comprising a 25 $\mu$m thick polyimide film and a 50 $\mu$m thick polyethylene terephthalate film) sandwiched between a pair of acrylic adhesive materials having a thickness of 60 $\mu$m.

Then, a plurality of metal wires 104 each serving as a collecting electrode were spacedly arranged on the transparent electrode layer 112 so that their end portions were situated on the insulating double-coated adhesive tape 113. To be more specific, 42 metal wires (only five metal wires are shown in the figure for the simplification purpose) were spacedly arranged on the transparent electrode layer 112 at an equal interval of 5.6 mm so that their end portions were situated on the insulating double-coated adhesive tape 113, where the end portions of the metal wires were fixed on the insulating double-coated adhesive tape.

Each of the metallic wires 104 used here comprises a metal wire whose surface is covered by a coat 106 comprising a semi-cured carbon paste which was prepared as will be described below.

A copper wire having a diameter in a range of 4 to 5 mm covered by a silver foil having a thickness of 50 μm was provided as a starting wire for the preparation of the metal wire 104. The starting wire was drawn by a drawing machine, to be reshaped into a fine metal wire having a diameter of 100 μm. The fine metal wire of 500 g was continuously wound around a bobbin. After the reshaping, the thickness of the silver foil as the cover (not shown) was 1 μm. Next, a coat 106 comprising a first electrically conductive paste containing carbon black powder was formed around the fine metal wire by a roll coater which is generally used for producing an enamel wire, to obtain a metal wire whose surface is covered by a coat (as the coat 106) having a two-layered structure comprising a perfectly cured inner layer and a semi-cured outer layer (not shown in the figure).

Specifically, the formation of the coat 106 comprising the inner layer and the outer layer around the fine metal wire was performed as will be described below.

The fine metal wire was rewound from the bobbin, and oily material deposited on the surface of the metal wire was removed with acetone. Then, the metal wire was made to continuously pass through a treatment bath in which a felt impregnated with a resin (a first resin) containing a filler for forming the inner layer was disposed. As the filler, there was used carbon black powder having an average particle size of 30±20 nm. The volume density of the carbon black powder was adjusted to 35%.

The first resin containing the filler was prepared by putting, in a paint shaker, the following components (the added amount of each component, based on the weight of a final mixture taken as 100): 37.1 parts by weight of carbon black powder as the filler; 6.4 parts by weight of butyral resin, and 4.2 parts by weight of cresol resin, phenol resin, and an aromatic hydrocarbon based resin; 18 parts by weight of diol isocyanate as a curing agent; 18 parts by weight of xylene, 12 parts by weight of diethyleneglycol monomethyl ether, and 3.6 parts by weight of cyclohexane respectively as a solvent; and 0.7 part by weight of γ-mercaptopropyl trimethoxysilane as a coupling agent, and mixing and dispersing the components in the paint shaker.

After having passed through the treatment bath, the metal wire was made to further pass through a bore formed in a die for removing unnecessary first resin containing the filler. The metal wire then was made to pass through a drying furnace for perfectly curing the first resin. At this time, the thickness of the coat layer as the inner layer was made to be 5 μm by adjusting the feed speed of the metal wire and the diameter of the bore formed in the die.

Next, the metal wire covered with the inner layer was similarly made to pass through a treatment bath in which a felt impregnated with a resin (a second resin) containing a filler for forming the outer layer was disposed. As the filler, there was used carbon black powder having an average particle size of 30±20 nm. The volume density of the carbon black powder was adjusted to 35%.

The resin containing the filler for forming the outer layer was prepared by putting, in a paint shaker, the following components (the added amount of each component, based on the weight of a final mixture taken as 100): 34.3 parts by weight of carbon black powder as the filler; 41 parts by weight of urethane resin and 14 parts by weight of phenoxy resin; 6 parts by weight of hydrogenated diphenylmethane diisocyanate as a curing agent; 4 parts by weight of an aromatic series solvent; and 0.7 part by weight of γ-mercaptopropyl trimethoxysilane as a coupling agent, and mixing and dispersing the components in the paint shaker.

After having passed through the treatment bath, the metal wire with the inner layer was made to further pass through a bore formed in a die for removing unnecessary second resin containing the filler. The metal wire with the cover obtained then was made to pass through a drying furnace to semi-cure the second resin, and was wound around a reel bobbin. The resistivity of the carbon paste used for the coating in this case was 0.5 Ω·cm. At this time, the thickness of the outer layer was made to be 20 μm by adjusting the feed speed of the metal wire and the diameter of the bore formed in the die. In this way, there was formed the coat 106 around the metal wire 104.

Step 3 [see, FIG. 1(c)]

In this step, part of the coat 106 of each of the metal wires 104 arranged on the surface of the transparent electrode layer of each photovoltaic body was removed to form a coat-removed portion 108 by irradiation YAG laser beam 114 to a portion of the coat 106 as will be described below.

YAG laser beam 114 was irradiated to a portion of the coat 106 of each of the metal wires 104 excluding the two metal wires 104e respectively situated on one of the outermost opposite sides of the arrangement of the metal wires from above as shown in FIG. 1(c), whereby part of the coat 106 of each of the metal wires involved was removed to form a coat-removed portion 108.

The YAG laser beam 114 used is a laser beam modulated into a pulse beam having a high output peak value by a conventional Q-switching manner. The scanning was performed by changing the direction of the laser beam by a galvanometer scanner using a rotary mirror. The laser beam was focused at a prescribed portion of the coat 106 of each metal wire through a fθ lens having a focal distance of 370 mm. The irradiation conditions of the laser beam were set as follows: the average output was set to 31 W (measured by a thermopile type measuring device); the pulse frequency was set to 12 kHz; the pulse width was set to several tens nsec; the scanning speed was set to 1200 mm/sec; and the spot diameter was set to about 100 μm. The scanning pattern was formed by arranging 34 pieces of parallel straight-lines having a width of 25 cm at a pitch of 56 μm. The scanning was performed by reciprocating the above-described scanning pattern having 34 pieces of straight-lines. With this scanning pattern, a rectangular area having a length of 25 cm and a width of 2 mm was overall irradiated with the laser beam 114. At this time, for each of the two outermost side metal wires 104e, a shielding mask 115 comprising a SUS stainless steel and having a surface capable of scattering the laser beam was arranged so that no laser beam was irradiated thereto.

The length of each of the formed cover-removed portions 108 in a direction along the metal wire was equal to the width 2 mm of the scanned area. Particularly, for each of the metal wires excluding the two outermost side metal wires 104e, a coat-removed portion 108 was formed, but no coat-removed portion was formed for the two outermost side metal wires 104e.

Step 4 [see, FIG. 1(d)]

In this step, a second electrically conductive paste 109 was adhered to each of the coat-removed portions 108 of the metal wires 104 excluding the two outermost side metal wires 104e as will be described below.

A second electrically conductive paste 109 comprising flaky silver particles having an average particle size of about 5 μm dispersed in a resin component containing methyl acrylate and a curing agent was applied to only each of the coat-removed portions 108 of the metal wires involved by means of a conventional dispenser having a nozzle shaped in an ellipse form. The second electrically conductive paste 109 was applied in an ellipse form (when viewed from above) so that the long axis of the ellipse form substantially intersected the longitudinal direction of the metal wire.

The long axis and the short axis of the ellipse form were respectively 1.5 mm and 0.8 mm. The volume density of the silver particles in the second electrically conductive paste was 85 wt. % before the paste was cured but it was 95 wt. % after the paste was cured. The resistivity of the second electrically conductive paste was $1.2 \times 10^{-5}$ Ω·cm.

Step 5 [see, FIGS. 1(e) and 1(f) Which is a View of a Cross Section Along the Line A–A' in FIG. 1(e)]

In this step, a bus bar electrode 102 was joined with all the metal wires 104 to form a first joining portion 105a and a second joining portion 105b as will be described below.

A bus bar electrode 102 comprising a copper foil having a thickness of 100 μm, a length of 240 mm and a width of 6 mm plated with a silver film having a thickness of 1 μm was superposed on the metal wires from above as shown in FIG. 1(e). Thereafter, the bus bar electrode 102 was pressurized from above so that it was fixed on the double-coated adhesive tape, whereby the bus bar electrode was close-contacted with the first electrically conductive paste or/and the second electrically conductive paste of each of the metal wires to form a first joining portion 105a or/and a second joining portion 105b. The resultant was introduced into a vacuum laminating furnace, where it was heated at 210° C. for 45 seconds while applying a pressure of 1 atm from above to cure the second electrically conductive paste of each of the metal wires excluding the two outermost side metal wires not having the second electrically conductive paste, whereby the formation of the second joining portion 105b of each of the former metal wires with the bus bar electrode was completed. In this case, since the heat and pressure were also applied to all the metal wires 104 on the transparent electrode layer 112, the coat 106 of each of the metal wires was thermally cared, whereby all the metal wires (as the collecting electrodes) were bonded and fixed onto the transparent electrode layer in an effective power generation area of the photovoltaic body. Thus, there was obtained a photovoltaic element.

In this way, there were prepared 100 photovoltaic elements.

In each of the resultant photovoltaic elements, the joining portion of each of the two outermost side collecting electrodes with the bus bar electrode was found to have a joining length of 0 mm for the second joining portion and a joining length of 6 mm for the first joining portion and the joining portion of each of the remaining collecting electrodes with the bus bar electrode was found to have a joining length of 2 mm for the second joining portion and a joining length of 4 mm for the first joining portion.

EXAMPLE 2

The procedures of Example 1 were repeated, except that a cover-removed portion having a width of 0.5 mm was also formed at each of the two outermost side metal wires using two shielding masks different from those used in Example 1, and the silver paste was applied to each of the two cover-removed portion in a complete round form, to prepare 100 photovoltaic elements.

In each of the resultant photovoltaic elements, the joining portion of each of the two outermost side collecting electrodes with the bus bar electrode was found to have a joining length of 0.5 mm for the second joining portion and a joining length of 5.5 mm for the first joining portion and the joining portion of each of the remaining collecting electrodes with the bus bar electrode was found to have a joining length of 2 mm for the second joining portion and a joining length of 4 mm for the first joining portion.

EXAMPLE 3

The procedures of Example 1 were repeated, except that a cover-removed portion having a width of 1.0 mm was also formed at each of the two outermost side metal wires using two shielding masks different from those used in Example 1, and the silver paste was applied to each of the two cover-removed portion in a complete round form, to prepare 100 photovoltaic elements.

In each of the resultant photovoltaic elements, the joining portion of each of the two outermost side collecting electrodes with the bus bar electrode was found to have a joining length of 1.0 mm for the second joining portion and a joining length of 5.0 mm for the first joining portion and the joining portion of each of the remaining collecting electrodes with the bus bar electrode was found to have a joining length of 2 mm for the second joining portion and a joining length of 4 mm for the first joining portion.

EVALUATION

1. An initial photoelectric conversion efficiency of each of the 100 photovoltaic elements obtained in each of Examples 1 to 3 was measured by a conventional method for measuring a photoelectric conversion efficiency of a photovoltaic element using a solar simulator (produced by Spire Co., Ltd.) wherein a pair of power output terminals extending from the solar simulator are connected to the positive and negative electrodes of the photovoltaic element.

And an average initial photoelectric conversion efficiency for the 100 photovoltaic elements obtained in each of Examples 1 to 3 was calculated. The results obtained are collectively shown in Table 1.

2. For each of the 100 photovoltaic elements obtained in each of Examples 1 to 3, a peel strength thereof was measured by pulling the bus bar electrode (102) toward an arrow mark shown in FIG. 1(e) using a peeling tester. Particularly, a peak intensity when the joining portion (105) of one of the two outermost side collecting electrodes (104e) [see, FIG. 1(c)] with the bus bar electrode was peeled was measured.

The minimum value of the peel strengths obtained in each case is shown in Table 1.

Based on the results obtained, the following facts are understood.

The 100 photovoltaic elements obtained in Example 1 are of such characteristics that the average initial photoelectric conversion efficiency is 10.71% and the minimum peel strength is 632 g and therefore, all the 100 photovoltaic elements are good enough in terms of the quality. And in the preparation of each of the 100 photovoltaic elements, no short circuit defect was occurred.

The 100 photovoltaic elements obtained in Example 2 are of such characteristics that the average initial photoelectric conversion efficiency is 10.82% and the minimum peel strength is 490 g and therefore, all the 100 photovoltaic elements are good enough in terms of the quality. And in the preparation of each of the 100 photovoltaic elements, no short circuit defect was occurred.

The 100 photovoltaic elements obtained in Example 3 are of such characteristics that the average initial photoelectric conversion efficiency is 10.88% and the minimum peel strength is 490 g and therefore, all the 100 photovoltaic elements are good enough in terms of the quality. And in the preparation of each of the 100 photovoltaic elements, no short circuit defect was occurred.

Thus, it is understood that even when the joining portion of each of the two outermost side collecting electrodes with the bus bar electrode comprises the first joining portion only, the photoelectric conversion efficiency is not substantially reduced in comparison with the case where the second joining portion is formed at the joining portion of the collecting electrode with the bus bar electrode in addition to the first joining portion. For the reason for this, it is considered as follows. That is, each of the opposite end portions of the photovoltaic body where the two outermost side collecting electrodes collect the electric current is situated in the vicinity of the etching line and therefore, it more or less suffers a damage due to the etching, and as a result, the quantity of the electric current generated in said end portions of the photovoltaic body is relatively small. Because of this, the quantity of the electric current from the photovoltaic body which is collected by the two outermost side collecting electrodes is smaller than the quantity of the electric current collected by the remaining collecting electrodes, and as a result, the electric resistance of each of the joining portions of the two outermost side collecting electrodes does not appreciably effect to the power loss.

EXAMPLE 4

Figure 5:
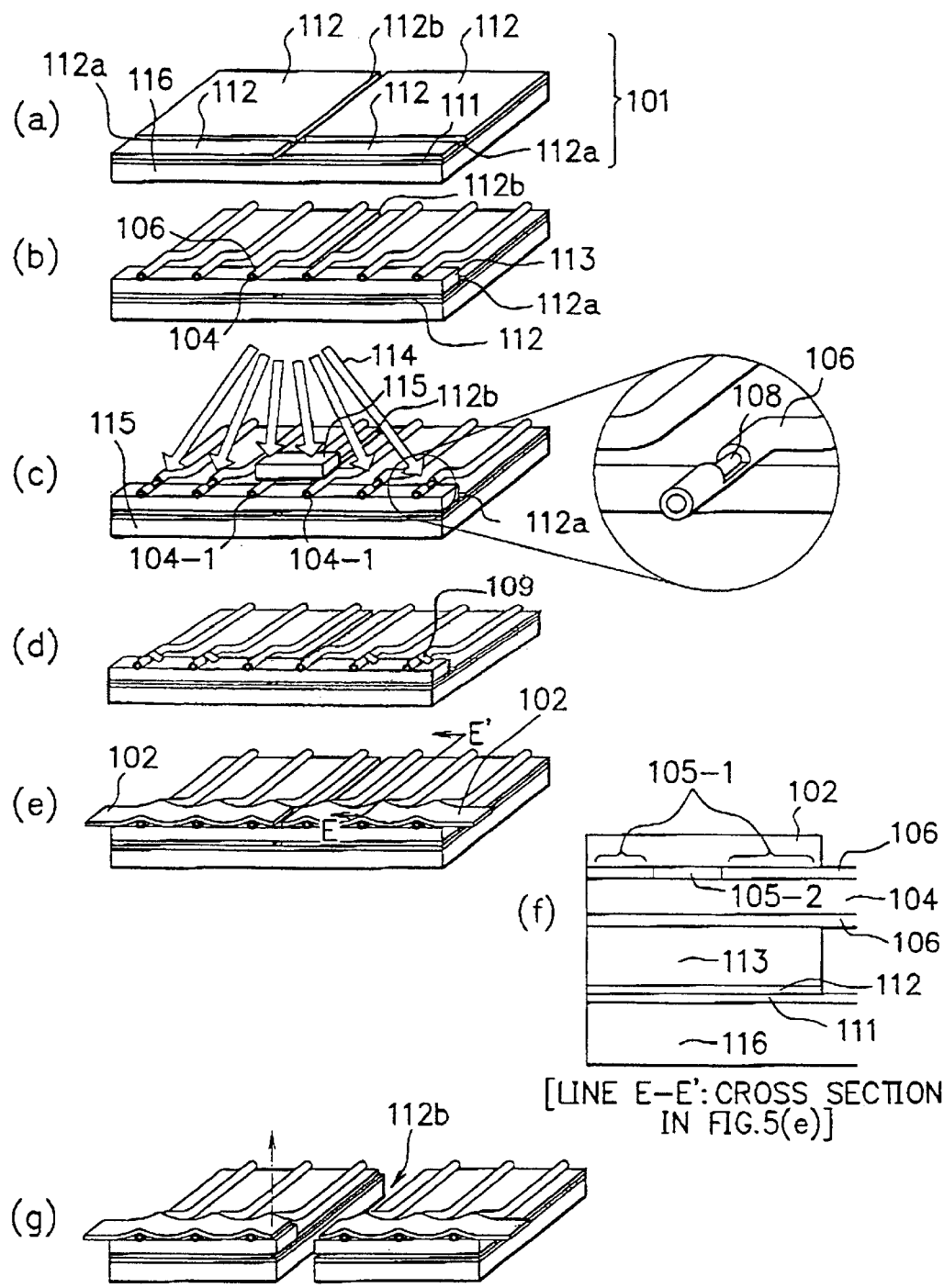
FIGS. 5(*a*) to 5(*g*) are schematic views for explaining a further example of a process for producing a photovoltaic element of the present invention.

FIGS. 5(a) to 5(g) are schematic views illustrating steps of producing a photovoltaic element in this example. FIG. 5(f) is a schematic cross-sectional view, taken along the line E–E' in FIG. 5(e).

Step 1 [see, FIG. 5(a)]

A photovoltaic body 101 was prepared as will be described below.

A stainless steel substrate 116 having a width of 36 mm and a thickness of 150 μm wound in a roll form was introduced into a roll-to-roll sputtering apparatus, where an Al layer (not shown) having a thickness of 200 nm and a ZnO layer (not shown) having a thickness of 1 μm were sequentially formed to form a two-layered lower electrode on the stainless steel substrate. The stainless steel substrate 116 having the two-layered lower electrode formed thereon was introduced into a microwave plasma CVD film-forming apparatus, where on the two-layered lower electrode formed on the stainless steel substrate 116, there was formed an amorphous silicon photoelectric conversion layer 111 having a stacked structure with three p-i-n junctions by sequentially forming a bottom semiconductor layer having a three-layered structure comprising an n-type semiconductor layer/ an i-type semiconductor layer/a p-type semiconductor layer; a middle semiconductor layer having a three-layered structure comprising an n-type semiconductor layer/an i-type semiconductor layer/a p-type semiconductor layer; and a top semiconductor layer having a three-layered structure comprising an n-type semiconductor layer/an i-type semiconductor layer/a p-type semiconductor layer.

Thereafter, on the photoelectric conversion layer 111, there was formed an ITO film having a thickness of 70 nm as a transparent electrode layer 112 having a function to serve also as a light reflection preventive layer was formed at a film-forming temperature of 450° C. by means of a sputtering process.

The stainless steel substrate 116 having the photoelectric conversion layer 111 and the transparent electrode layer 112 formed thereon was cut to obtain a plurality of photovoltaic bodies having a width of 24 cm and a length of 18 cm. For each of the resultant photovoltaic bodies, a peripheral portion 112a having a width of 1 mm of the transparent electrode layer 112 in the longitudinal direction was removed (not shown) to form a division groove 112a having a width of 1 mm. Similarly, a central portion 112b having a width of 1 mm of the transparent electrode layer 112 in the width direction was removed (not shown) to form a central division groove 112b having a width of 1 mm.

An electrolytic etching process was used for removing each prescribed portion of the transparent electrode layer, wherein the substrate (the photovoltaic body) was dipped in a sulfuric acid solution and an electric field was applied between the substrate and a counter electrode.

Thus, a plurality of photovoltaic bodies 101 having such configuration as shown in FIG. 5(a) were obtained.

Step 2 [see, FIG. 5(b)]

In this step, a plurality of metal wires 104 whose surfaces are covered by a semi-cured coat were spacedly arranged and fixed on the surface of each photovoltaic body 101 as will be described below.

An insulating double-coated adhesive tape 113 having a width of 7 mm and a length of 240 mm was fixed on the transparent electrode layer 112 of each photovoltaic body 101. To be more specific, the insulating double-coated adhesive tape 113 was stuck on the divided portion of the transparent electrode layer 112 situated outside the division groove 112a as shown in FIG. 5(b).

As the insulating double-coated adhesive tape 113, there was used a double-coated adhesive tape comprising a base member (comprising a composite comprising a 25 μm thick polyimide film and a 50 μm thick polyethylene terephthalate film) sandwiched between a pair of acrylic adhesive materials having a thickness of 60 μm.

Then, a plurality of metal wires 104 each serving as a collecting electrode were spacedly arranged on the transparent electrode layer 112 so that their end portions were situated on the insulating double-coated adhesive tape 113. To be more specific, 42 metal wires (only five metal wires are shown in the figure for the simplification purpose) were spacedly arranged on the transparent electrode layer 112 at an equal interval of 5.6 mm so that their end portions were situated on the insulating double-coated adhesive tape 113, where the end portions of the metal wires were fixed on the insulating double-coated adhesive tape.

Each of the metallic wires 104 used here comprises a metal wire whose surface is covered by a coat 106 comprising a semi-cured carbon paste which was prepared as will be described below.

A copper wire having a diameter in a range of 4 to 5 mm covered by a silver foil having a thickness of 50 μm was provided as a starting wire for the preparation of the metal wire 104. The starting wire was drawn by a drawing machine, to be reshaped into a fine metal wire having a diameter of 100 μm. The fine metal wire of 500 g was continuously wound around a bobbin. After the reshaping, the thickness of the silver foil as the cover (not shown) was 1 μm. Next, a coat 106 comprising a first electrically conductive paste containing carbon black powder was formed around the fine metal wire by a roll coater which is generally used for producing an enamel wire, to obtain a metal wire whose surface is covered by a coat (as the coat 106) having a two-layered structure comprising a perfectly cured inner layer and a semi-cured outer layer (not shown in the figure).

Specifically, the formation of the coat 106 comprising the inner layer and the outer layer around the fine metal wire was performed as will be described below.

The fine metal wire was rewound from the bobbin, and oily material deposited on the surface of the metal wire was removed with acetone. Then, the metal wire was made to continuously pass through a treatment bath in which a felt impregnated with a resin (a first resin) containing a filler for forming the inner layer was disposed. As the filler, there was used carbon black powder having an average particle size of 30±20 nm. The volume density of the carbon black powder was adjusted to 35%.

The first resin containing the filler was prepared by putting, in a paint shaker, the following components (the added amount of each component, based on the weight of a final mixture taken as 100): 37.1 parts by weight of carbon black powder as the filler; 6.4 parts by weight of butyral resin, and 4.2 parts by weight of cresol resin, phenol resin, and an aromatic hydrocarbon based resin; 18 parts by weight of diol isocyanate as a curing agent; 18 parts by weight of xylene, 12 parts by weight of diethyleneglycol monomethyl ether, and 3.6 parts by weight of cyclohexane respectively as a solvent; and 0.7 part by weight of γ-mercaptopropyl trimethoxysilane as a coupling agent, and mixing and dispersing the components in the paint shaker.

After having passed through the treatment bath, the metal wire was made to further pass through a bore formed in a die for removing unnecessary first resin containing the filler. The metal wire then was made to pass through a drying furnace for perfectly curing the first resin. At this time, the thickness of the coat layer as the inner layer was made to be 5 μm by adjusting the feed speed of the metal wire and the diameter of the bore formed in the die.

Next, the metal wire covered with the inner layer was similarly made to pass through a treatment bath in which a felt impregnated with a resin (a second resin) containing a filler for forming the outer layer was disposed. As the filler, there was used carbon black powder having an average particle size of 30±20 nm. The volume density of the carbon black powder was adjusted to 35%.

The resin containing the filler for forming the outer layer was prepared by putting, in a paint shaker, the following components (the added amount of each component, based on the weight of a final mixture taken as 100): 34.3 parts by weight of carbon black powder as the filler; 41 parts by weight of urethane resin and 14 parts by weight of phenoxy resin; 6 parts by weight of hydrogenated diphenylmethane diisocyanate as a curing agent; 4 parts by weight of an aromatic series solvent; and 0.7 part by weight of γ-mercaptopropyl trimethoxysilane as a coupling agent, and mixing and dispersing the components in the paint shaker.

After having passed through the treatment bath, the metal wire with the inner layer was made to further pass through a bore formed in a die for removing unnecessary second resin containing the filler. The metal wire with the cover obtained then was made to pass through a drying furnace to semi-cure the second resin, and was wound around a reel bobbin. The resistivity of the carbon paste used for the coating in this case was 0.5 Ω·cm. At this time, the thickness of the outer layer was made to be 20 μm by adjusting the feed speed of the metal wire and the diameter of the bore formed in the die. In this way, there was formed the coat 106 around the metal wire 104.

Step 3 [see, FIG. 5(c)]

In this step, part of the coat 106 of each of the metal wires 104 arranged on the surface of the transparent electrode layer of each photovoltaic body was removed to form a coat-removed portion 108 by irradiation YAG laser beam 114 to a portion of the coat 106 as will be described below.

YAG laser beam 114 was irradiated to a portion of the coat 106 of each of the metal wires 104 excluding the two metal wires 104-1 respectively situated on one of opposite sides of the central division groove 112b so as to oppose to each other [see, FIG. 5(c)], whereby part of the coat 106 of each of the metal wires involved was removed to form a coat-removed portion 108.

The YAG laser beam 114 used is a laser beam modulated into a pulse beam having a high output peak value by a conventional Q-switching manner. The scanning was performed by changing the direction of the laser beam by a galvanometer scanner using a rotary mirror. The laser beam was focused at a prescribed portion of the coat 106 of each metal wire through a fθ lens having a focal distance of 370 mm. The irradiation conditions of the laser beam were set as follows: the average output was set to 31 W (measured by a thermopile type measuring device); the pulse frequency was set to 12 kHz; the pulse width was set to several tens nsec; the scanning speed was set to 1200 mm/sec; and the spot diameter was set to about 100 μm. The scanning pattern was formed by arranging 34 pieces of parallel straight-lines having a width of 25 cm at a pitch of 56 μm. The scanning was performed by reciprocating the above-described scanning pattern having 34 pieces of straight-lines. With this scanning pattern, a rectangular area having a length of 25 cm and a width of 2 mm was overall irradiated with the laser beam 114. At this time, for the two metal wires 104-1, a shielding mask 115 comprising a SUS stainless steel and having a surface capable of scattering the laser beam was arranged so that no laser beam was irradiated thereto.

The length of each of the formed cover-removed portions 108 in a direction along the metal wire was equal to the width 2 mm of the scanned area. Particularly, for each of the metal wires excluding the two metal wires 104-1, a coat-removed portion 108 was formed, but no coat-removed portion was formed for the two metal wires 104-1.

Step 4 [see, FIG. 5(d)]

In this step, a second electrically conductive paste 109 was adhered to each of the coat-removed portions 108 of the metal wires.104 excluding the two metal wires 104-1 as will be described below.

A second electrically conductive paste 109 comprising flaky silver particles having an average particle size of about 5 μm dispersed in a resin component containing methyl acrylate and a curing agent was applied to only each of the coat-removed portions 108 of the metal wires involved by means of a conventional dispenser having a nozzle shaped in an ellipse form. The second electrically conductive paste 109 was applied in an ellipse form (when viewed from above) so that the long axis of the ellipse form substantially intersected the longitudinal direction of the metal wire.

The long axis and the short axis of the ellipse form were respectively 1.5 mm and 0.8 mm. The volume density of the silver particles in the second electrically conductive paste was 85 wt. % before the paste was cured but it was 95 wt. % after the paste was cured. The resistivity of the second electrically conductive paste was $1.2 \times 10^{-5}$ Ω·cm.

Step 5 [see, FIGS. 5(e) and 5(f) Which is a View of a Cross Section Along the Line E–E' in FIG. 5(e)]

In this step, a bus bar electrode 102 was joined with all the metal wires 104 to form a first joining portion 105-1 and a second joining portion 105-2 as will be described below.

A bus bar electrode 102 comprising a copper foil having a thickness of 100 μm, a length of 260 mm and a width of 6 mm plated with a silver film having a thickness of 1 μm was superposed on the metal wires from above as such that opposite side end portions of the bus bar electrodes were projected respectively from one of the opposite side end portions of the photovoltaic body as shown in FIG. 5(e).

Thereafter, the bus bar electrode 102 was pressurized from above so that it was fixed on the double-coated adhesive tape, whereby the bus bar electrode was close-contacted with the first electrically conductive paste or/and the second electrically conductive paste of each of the metal wires to form a first joining portion 105-1 or/and a second joining portion 105-2. The resultant was introduced into a vacuum laminating furnace, where it was heated at 210° C. for 45 seconds while applying a pressure of 1 atm from above to cure the second electrically conductive paste of each of the metal wires excluding the two metal wires 104-1 not having the second electrically conductive paste, whereby the formation of the second joining portion 105-2 of each of the former metal wires with the bus bar electrode was completed. In this case, since the heat and pressure were also applied to all the metal wires 104 on the transparent electrode layer 112, the coat 106 of each of the metal wires was thermally cured, whereby all the metal wires (as the collecting electrodes) were bonded and fixed onto the transparent electrode layer in an effective power generation area of the photovoltaic body.

Step 6 [see, FIG. 5(g)]

The resultant obtained in the above step 5 was cut along the central division groove 112b [see, FIG. 5(a)] by means of a shearing press machine to obtain two photovoltaic elements.

In this way, there were prepared 100 photovoltaic elements.

In each of the resultant photovoltaic elements, the joining portion of the collecting electrode (104-1) [situated beside the central division groove 112b] with the bus bar electrode was found to have a joining length of 0 mm for the second joining portion and a joining length of 6 mm for the first joining portion and the joining portion of each of the remaining collecting electrodes with the bus bar electrode was found to have a joining length of 2 mm for the second joining portion and a joining length of 4 mm for the first joining portion.

EVALUATION

1. An initial photoelectric conversion efficiency of each of the 100 photovoltaic elements obtained in Example 4 was measured by a conventional method for measuring a photoelectric conversion efficiency of a photovoltaic element using a solar simulator (produced by Spire Co., Ltd.) wherein a pair of power output terminals extending from the solar simulator are connected to the positive and negative electrodes of the photovoltaic element.

Based on the measured initial photoelectric conversion efficiencies for the 100 photovoltaic elements, an average initial photoelectric conversion efficiency was calculated. As a result, the average initial photoelectric conversion efficiency was found to be 10.72%. This result is shown in Table 2.

2. For each of the 100 photovoltaic elements obtained in Example 4, a peel strength thereof was measured by pulling the bus bar electrode (102) toward an arrow mark shown in FIG. 5(g) using a peeling tester. Particularly, a peak intensity when the joining portion of the collecting electrode (104-1) [situated beside the central division groove 112b] with the bus bar electrode was peeled was measured.

The minimum value of the peel strengths obtained is shown in Table 2. Particularly, the minimum value was found to be 631g.

Based on the results obtained, the following facts are understood.

The 100 photovoltaic elements obtained in Example 4 are of such characteristics that the average initial photoelectric conversion efficiency is 10.72% and the minimum peel strength is 632 g and therefore, all the 100 photovoltaic elements are good enough in terms of the quality. And in the preparation of the 100 photovoltaic elements, no short Circuit defect was occurred.

For the reason why all the 100 photovoltaic elements obtained in Example 4 are good enough in terms of the quality, it is considered such that in each of the 100 photovoltaic elements, the joining portion (i) of the collecting electrode 104-1 [situated beside the central division groove 112b] with the bus bar electrode 102 comprises the first joining portion 105-1 only and this joining portion (i) is capable of being sufficiently endured against the load applied when the photovoltaic body is divided along the central division groove 112b; the joining portion (ii) of each of the collecting electrodes (excluding the collecting electrode 104-1) with the bus bar electrode additionally comprise the second joining portion 105-2 whose resistivity is relatively small and therefore, the electric resistance of the joining portion (ii) is relatively small; thus, in each of the 100 photovoltaic elements, the joining portion (i) has a sufficient durability against the load applied thereto and the joining portion (ii) is small in terms of the electric resistance; because of this, all the 100 photovoltaic elements have such satisfactory characteristics as above described.

As will be understood from the above description, the present invention makes it possible to realize a photovoltaic element having an enduring electrode structure in which the joining portions of the collecting electrodes with the bus bar electrode have a sufficient strength and are small in terms of the electric resistance and which excels in durability and always affords a high output power. Further, in accordance with the process for the production of a photovoltaic element, it is possible to mass-produce a plurality of photovoltaic elements having such enduring electrode structure as above described and which excel in durability and always afford a high output power, at a high yield.

TABLE 1

|  | length of the first joining portion of the end-sided collecting electrode [mm] | length of the second joining portion of the end-sided collecting electrode [mm] | the minimum peel strength value [g] | proportion defective [%] | average initial photoelectric conversion efficiency [%] |
| --- | --- | --- | --- | --- | --- |
| Example 1 | 6.0 | 0.0 | 632 | 0 | 10.71 |
| Example 2 | 5.5 | 0.5 | 490 | 0 | 10.85 |
| Example 3 | 5.0 | 1.0 | 490 | 0 | 10.88 |

TABLE 2

| | length of the first joining portion of the end-sided collecting electrode [mm] | length of the second joining portion of the end-sided collecting electrode [mm] | the minimum peel strength value [g] | proportion defective [%] | average initial photoelectric conversion efficiency [%] |
|---|---|---|---|---|---|
| Example 4 | 6.0 | 0.0 | 631 | 0 | 10.72 |

What is claimed is:

1. A photovoltaic element having at least a photoelectric conversion layer, a plurality of collecting electrodes spacedly arranged over a light receiving face of said photoelectric conversion layer in parallel to each other and a bus bar electrode which is joined to said plurality of collecting electrodes to have a plurality of joining portions (A) in which said plurality of collecting electrodes are individually joined to said bus bar electrode, wherein each of said plurality of joining portions (A) has a first joining portion (i) comprising a first paste, at least one of collecting electrodes (b) excluding collecting electrodes (a) positioned at opposite ends of the arrangement of said plurality of collecting electrodes further has a second joining portion (ii) comprising a second paste having a smaller resistivity than that of said first paste at the joining portion (A) thereof with the bus bar electrode, and a proportion of the first joining portion (i) in the joining portion (A) of the collecting electrode and the bus bar electrode with respect to each of the collecting electrodes (a) is greater than a proportion of the first joining portion (i) in the joining portion (A) of the collecting electrode and the bus bar electrode with respect to said at least one of the collecting electrodes (b).

2. A photovoltaic element according to claim 1, wherein the joining portion (A) of each of the collecting electrodes (a) has only the first joining portion (i) comprising the first paste.

3. A photovoltaic element according to claim 1, wherein each of said plurality of joining portions (A) has a first joining portion (i) comprising a first paste, each of the collecting electrodes (b) excluding the collecting electrodes (a) positioned at opposite ends of the arrangement of said plurality of collecting electrodes further has a second joining portion (ii) comprising a second paste having a smaller resistivity than that of said first paste at the joining portion (A) thereof with the bus bar electrode, and a proportion of the first joining portion (i) in the joining portion (A) of the collecting electrode and the bus bar electrode with respect to each of the collecting electrodes (a) is greater than a proportion of the first joining portion (i) in the joining portion (A) of the collecting electrode and the bus bar electrode with respect to each of the collecting electrodes (b).

4. A photovoltaic element according to claim 1, wherein each of the collecting electrodes comprises a metal wire.

5. A photovoltaic element according to claim 1, wherein each of the collecting electrodes comprises a metal wire covered by a coat comprising an electrically conductive paste, and said electrically conductive paste serves also as the first paste.

6. A photovoltaic element according to claim 1, wherein the first paste comprises a carbon paste and the second paste comprises a metal powder paste.

7. A process for producing a photovoltaic element having at least a photoelectric conversion layer, a plurality of collecting electrodes spacedly arranged over a light receiving face of said photoelectric conversion layer in parallel to each other and a bus bar electrode which is joined to said plurality of collecting electrodes to have a plurality of joining portions in which said plurality of collecting electrodes are individually joined to said bus bar electrode, said process comprising the steps of:

(1) providing a photovoltaic body having at least a photoelectric conversion layer, (2) spacedly arranging a plurality of collecting electrodes (a) having a coat comprising a first paste over a light receiving face of said photoelectric conversion layer of said photovoltaic body in parallel to each other, (3) of said plurality of collecting electrodes (a), removing part of the coat of at least one of collecting electrodes (a-i) excluding collecting electrodes (a-ii) positioned at opposite side ends of the arrangement of the collecting electrodes (a), (4) for the coat of each of the collecting electrodes (a-ii), not removing part thereof or removing part thereof which is smaller than the part in said step (3), (5) applying a second paste whose resistivity is smaller than that of the first paste to the coat-removed portion of each of the collecting electrodes whose coats are partly removed, and (6) arranging a bus bar electrode over the collecting electrodes (a) to cover their coat-removed portions and joining said bus bar electrode to the collecting electrodes (a) to form an electrode structure over said photoelectric conversion layer.

8. The process according to claim 7, wherein instead of said steps (3) to (5), said process including the steps of:

(i) of said plurality of collecting electrodes (a), removing part of the coat of each of the collecting electrodes (a-i) excluding the collecting electrodes (a-ii) positioned at opposite side ends of the arrangement of the collecting electrodes (a), (ii) for the coat of each of the collecting electrodes (a-ii), not removing part thereof or removing part thereof which is smaller than the part in said step (i), and (iii) applying a second paste whose resistivity is smaller than that of the first paste to the coat-removed portion of each of the collecting electrodes whose coats are partly removed.

9. The process according to claim 7 or 8, wherein the second paste is applied in an ellipse form having a long axis in a direction intersecting the longitudinal direction of the collecting electrode.

10. The process according to claim 7 or 8, wherein the second paste is applied to the coat-removed portion of each of the collecting electrodes (a-ii) in a complete round form and the second paste is applied to the coat-removed portion of each of the collecting electrodes (a-i) in an ellipse form having a long axis in a direction intersecting the longitudinal direction of the collecting electrode.

11. The process according to claim 7 or 8, wherein the step of removing part of the coat of the collecting electrode includes a step of irradiating a laser beam to the coat of the collecting electrode.

12. The process according to claim 7 or 8, wherein each of the collecting electrodes comprises a metal wire.

13. The process according to claim 7 or 8, wherein each of the collecting electrodes comprises a metal wire covered by a coat comprising an electrically conductive paste, and said electrically conductive paste serves also as the first paste.

14. The process according to claim 7 or 8, wherein the first paste comprises a carbon paste and the second paste comprises a metal powder paste.

15. A process for producing a photovoltaic element having at least a photoelectric conversion layer, a plurality of collecting electrodes spacedly arranged over a light receiving face of said photoelectric conversion layer in parallel to each other and a bus bar electrode which is joined to said plurality of collecting electrodes to have a plurality of joining portions in which said plurality of collecting electrodes are individually joined to said bus bar electrode, said process comprising the steps of:

(1) providing a photovoltaic body having a light receiving face, said photovoltaic body having a transparent electrode layer and a photoelectric conversion layer stacked in this order from the light receiving face side, (2) forming a division groove on a light receiving face of said transparent electrode layer of said photovoltaic body in a direction perpendicular to the longitudinal direction of the photovoltaic body so that the light receiving face of the transparent electrode layer has two zones which are divided by said division groove, (3) spacedly arranging a plurality of collecting electrodes (i-a) having a coat comprising a first paste over the light receiving face of the transparent electrode layer of the photovoltaic body such that said plurality of collecting electrodes are in parallel to the division groove of the transparent electrode layer so that two of the collecting electrodes are positioned on opposite sides of the division groove so as to oppose to each other, (4) of the collecting electrodes (i-a) arranged over the light receiving face of the transparent electrode layer, removing part of the coat of at least one of collecting electrodes (i-a') excluding collecting electrodes (i-a") positioned on the opposite sides of the division groove, (5) for the coat of each of the collecting electrodes (i-a"), not removing part thereof or removing part thereof which is smaller than the part in said step (4), (6) applying a second paste whose resistivity is smaller than that of the first paste to the coat-removed portion of each of the collecting electrodes whose coats are partly removed, (7) arranging a bus bar electrode over the collecting electrodes (i-a) so as to cover their coat-removed portions and joining said bus bar electrode to the collecting electrodes (i-a), and (8) cutting the photovoltaic body along the division groove of the transparent electrode layer to obtain a plurality of photovoltaic elements.

16. The process according to claim 15, wherein instead of said steps (4) to (6), said process includes the steps of:

(a) of the collecting electrodes (i-a) arranged over the light receiving face of the transparent electrode layer, removing part of the coat of each of the collecting electrodes (i-a') excluding the collecting electrodes (i-a") positioned on the opposite sides of the division groove, (b) for the coat of each of the collecting electrodes (i-a"), not removing part thereof or removing part thereof which is smaller than the part in said step (a), and (c) applying a second paste whose resistivity is smaller than that of the first paste to the coat-removed portion of each of the collecting electrodes whose coats are partly removed.

17. The process according to claim 15 or 16, wherein the second paste is applied in an ellipse form having a long axis in a direction intersecting the longitudinal direction of the collecting electrode.

18. The process according to claim 15 or 16, wherein the second paste is applied to the coat-removed portion of each of the collecting electrodes (i-a") in a complete round form and the second paste is applied to the coat-removed portion of each of the collecting electrodes (i-a') in an ellipse form having a long axis in a direction intersecting the longitudinal direction of the collecting electrode.

19. The process according to claim 15 or 16, wherein the step of removing part of the coat of the collecting electrode includes a step of irradiating a laser beam to the coat of the collecting electrode.

20. The process according to claim 15 or 16, wherein each of the collecting electrodes comprises a metal wire.

21. The process according to claim 15 or 16, wherein each of the collecting electrodes comprises a metal wire covered by a coat comprising an electrically conductive paste, and said electrically conductive paste serves also as the first paste.

22. The process according to claim 15 or 16, wherein the first paste comprises a carbon paste and the second paste comprises a metal powder paste.

* * * * *

UNITED STATES PATENT AND TRADEMARK OFFICE
CERTIFICATE OF CORRECTION

PATENT NO. : 6,689,951 B2
DATED : February 10, 2004
INVENTOR(S) : Koichi Shimizu et al.

It is certified that error appears in the above-identified patent and that said Letters Patent is hereby corrected as shown below:

Title page,
Item [75], Inventors, "Koichi Shimizu, Kyoto-fu (JP); Tsutomu Murakami, Nara-ken (JP); Koji Tsuzuki, Kyouto-fu (JP)" should read -- Koichi Shimizu, Kyoto (JP); Tsutomu Murakami, Nara (JP); Koji Tsuzuki, Nara (JP) --.

Column 2,
Line 49, "sides-of" should read -- sides of --.

Column 3,
Line 54, "glove" should read -- groove --.

Column 4,
Line 3, "glove," should read -- groove, --.
Line 16, "glove" should read -- groove --.

Column 5,
Line 31, "flows the" should read -- flows to the --.

Column 6,
Line 60, "fist" should read -- first --.
Line 64, "includes" should read -- include --.

Column 7,
Line 36, "surf" should read -- surf- --.

Column 8,
Line 2, "par" should read -- part --.
Line 11, "requited" should read -- required --.
Line 34, "beat" should read -- heat --.
Line 34, "shilding" should read -- shielding --.

Column 9,
Line 67, "coining" should read -- joining --.

Column 10,
Line 26, "includes" should read -- include --.
Lines 37-38 and 40, "comprising" should read -- comprise --.
Line 50, "bodies.," should read -- bodies, --.

Column 11,
Line 46, "correcting" should read -- collecting --.

UNITED STATES PATENT AND TRADEMARK OFFICE
CERTIFICATE OF CORRECTION

PATENT NO. : 6,689,951 B2
DATED : February 10, 2004
INVENTOR(S) : Koichi Shimizu et al.

It is certified that error appears in the above-identified patent and that said Letters Patent is hereby corrected as shown below:

Column 12,
Line 52, "includes" should read -- include --.

Column 14,
Line 10, "a-type" should read -- n-type --.

Column 17,
Line 64, "portion" should read -- portions --.

Column 18,
Line 15, "portion" should read -- portions --.

Column 19,
Line 29, "effect to" should read -- effect --.

Column 22,
Line 38, "wires.104" should read -- wires 104 --.

Column 24,
Line 19, "Circuit" should read -- circuit --.

Column 26,
Line 38, "including" should read -- includes --.

Signed and Sealed this

Twenty-fourth Day of August, 2004

JON W. DUDAS
*Director of the United States Patent and Trademark Office*